United States Patent
Freeman et al.

(10) Patent No.: US 6,519,539 B1
(45) Date of Patent: Feb. 11, 2003

(54) MEASUREMENT OF FUEL CELL IMPEDANCE

(75) Inventors: Norman A. Freeman, Toronto (CA); Stephane Masse, Toronto (CA); Ravi B. Gopal, Toronto (CA); Pierre Rivard, Toronto (CA)

(73) Assignee: Hydrogenics Corporation, Mississauga (CA)

( * ) Notice: Subject to any disclaimer, the term of this patent is extended or adjusted under 35 U.S.C. 154(b) by 0 days.

(21) Appl. No.: 09/672,040

(22) Filed: Sep. 29, 2000

(51) Int. Cl.[7] .............................................. G01R 27/00
(52) U.S. Cl. .......................................... 702/65; 702/64
(58) Field of Search ............................. 702/57, 64, 65, 702/182, 189; 73/112; 320/101, 165; 429/17, 19, 21, 24

(56) References Cited

U.S. PATENT DOCUMENTS

| | | | |
|---|---|---|---|
| 3,676,770 A | 7/1972 | Sharaf et al. ............... | 324/29.5 |
| 3,753,094 A | 8/1973 | Furuishi et al. ............ | 324/29.5 |
| 4,071,819 A * | 1/1978 | De Santis ................. | 324/58 B |
| 4,697,134 A | 9/1987 | Burkum et al. .............. | 320/48 |
| 4,743,855 A | 5/1988 | Randin et al. | |
| 5,047,722 A | 9/1991 | Wurst et al. ................. | 324/430 |
| 5,773,978 A | 6/1998 | Becker ........................ | 324/430 |
| 5,925,476 A * | 7/1999 | Kawatsu ....................... | 429/24 |
| 6,002,238 A | 12/1999 | Champlin .................... | 320/134 |
| 6,011,379 A * | 1/2000 | Singh et al. ................. | 320/132 |
| 6,037,777 A | 3/2000 | Champlin .................... | 324/430 |
| 6,160,382 A * | 12/2000 | Yoon et al. .................. | 320/136 |

FOREIGN PATENT DOCUMENTS

| | | | | |
|---|---|---|---|---|
| JP | 359215674 A | * 12/1984 | .................. | 429/22 |
| WO | WO 99/18448 | 4/1999 | | |
| WO | WO 00/31557 | 6/2000 | | |

* cited by examiner

*Primary Examiner*—Marc S. Hoff
*Assistant Examiner*—Paul Kim
(74) *Attorney, Agent, or Firm*—Bereskin & Parr

(57) ABSTRACT

This invention discloses a self-contained, portable, cost-effective apparatus for measuring the real and imaginary components of a fuel cell's complex impedance at discrete frequencies. The apparatus comprises a CPU, a signal generation device, a fuel cell, a load bank, current and voltage sensing circuitry and a waveform acquisition device. The measurements can be done in real time and automated. The fuel cell's internal resistance can be calculated thereby providing an indication of the electrical efficiency of the fuel cell.

20 Claims, 2 Drawing Sheets

MEASUREMENT OF FUEL CELL IMPEDANCE

FIELD OF THE INVENTION

Figure 1:
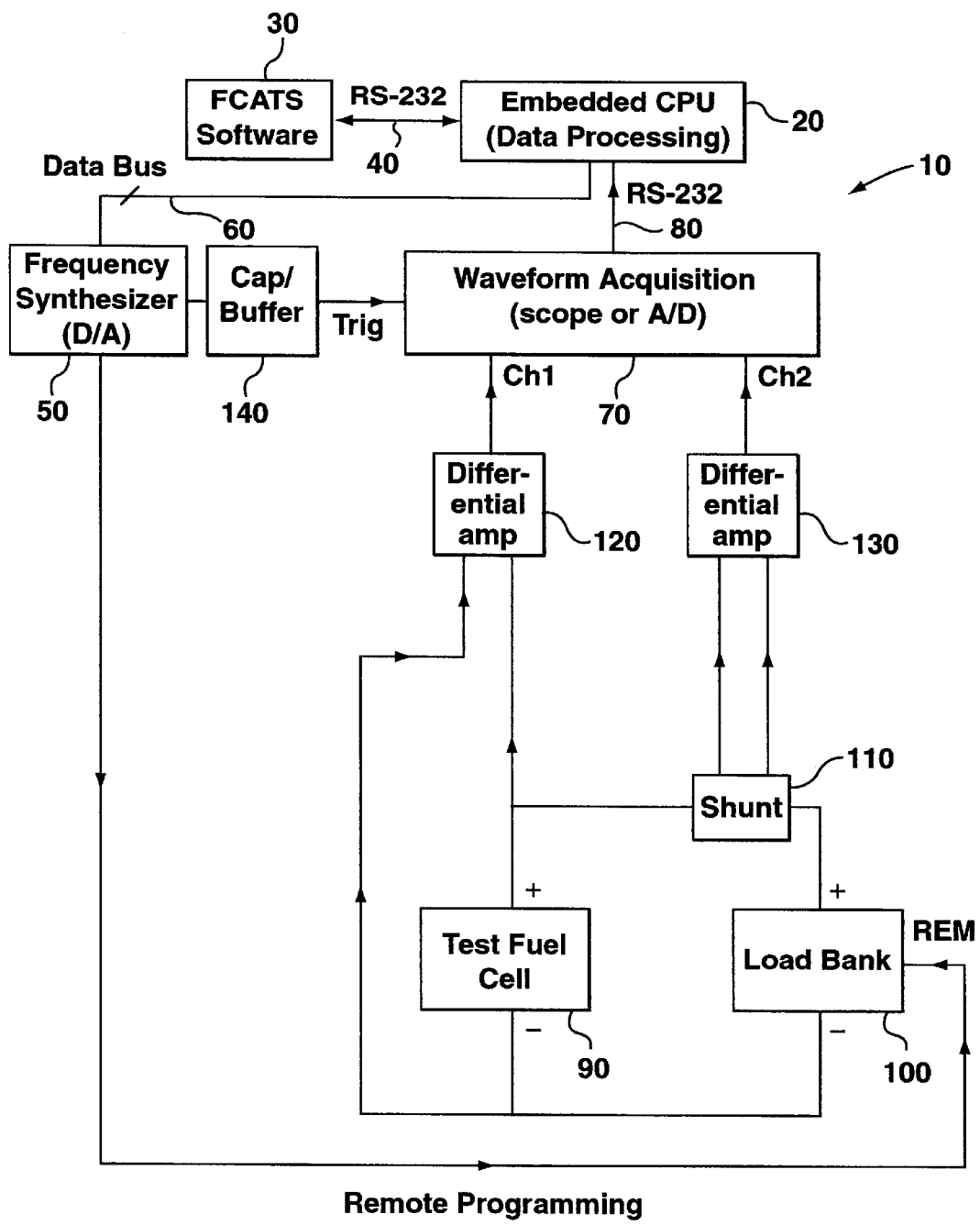

This invention relates to measurement of fuel cell impedance, and in particular, to a self-contained, portable apparatus for obtaining real-time measurements of a fuel cell's internal resistance.

BACKGROUND OF THE INVENTION

Fuel cells are becoming increasingly important as alternative energy sources as seen by the estimated 3 billion dollar market for fuel cells in 2000. This is due to their advantages over conventional power sources such as the battery and the internal-combustion engine. For instance, a fuel cell can supply electrical energy over a longer time period than a battery because it can be constantly supplied with air and fuel (i.e. hydrogen, reformed natural gas (hydrogen-rich gas) and methanol). Furthermore, a fuel cell does not run down or require recharging. Fuel cells are also high-efficiency devices, with efficiencies as high as 60 percent. This is much better than the internal-combustion engine which has an efficiency of up to 40 percent. Fuel cells also emit no noxious gases, since the fuel cell relies on a chemical reaction versus combustion, and generate very little noise when in operation. All of these features make the fuel cell highly desirable as power sources for automobiles, buses, municipal power generation stations, space missions and cellular phones.

To evaluate a fuel cell's electrical efficiency, its internal resistance is determined which is achieved through AC Impedance measurement. This measurement is important because it allows for the examination of various physical and chemical characteristics of the fuel cell. This impedance measurement may also be used in a feedback mechanism to improve the fuel cell's performance.

The literature indicates that complex impedance measurements on fuel cells can only be performed using expensive bench-top laboratory equipment, consisting of many subsystems interfaced with one another. For example: T. E. Springer, T. A. Zawodzinski, M. S. Wilson and S. Gottesfield, "Characterization of polymer electrolyte fuel cells using AC Impedance spectroscopy", Journal of the Electrochemical Society of America, 143(2), p. 587–599, 1996; J. R. Selman and Y. P. Lin, "Application of AC impedance in fuel cell research and development", Electrochemica Acta, 38(14), p. 2063–2073, 1993; B. Elsener and H. Bolmi, "Computer-assisted DC and AC techniques in electrochemical investigations of the active-passive transition", Corrosion Science, 23(4), p. 341–352, 1983. Such known equipment is manually controlled, with no automation in place. No single known approach allows the use of a portable, integrated measurement system. In addition, no measurement equipment is integrated into these systems which permits modification of fuel cell operating parameters.

Furthermore, the patent literature shows that the measurement of complex impedance is primarily known for use on batteries. In addition, these patents only claimed to measure a single quantity, namely "impedance" (U.S. Pat Nos. 4,697,134 and 5,773,978) or "resistance" (U.S. Pat Nos. 3,753,094, 3,676,770 and 5,047,722). The previous patent relating to measuring impedance on an electrochemical cell (U.S. Pat No. 6,002,238), not necessarily a fuel cell, used an entirely different, yet complicated approach. Furthermore, this approach could not be directly applied to fuel cells due to the high currents associated with the latter.

Thus the issues which still need to be addressed and improved in fuel cell impedance measurement are portability, fuel cell applicability, measurement variety and resolution, automation and cost.

Generally, a fuel cell is a device which converts the energy of a chemical reaction into electricity. It differs from a battery in that the fuel cell can generate power as long as the fuel and oxidant are supplied.

A fuel cell produces an electromotive force by bringing the fuel and oxidant into contact with two suitable electrodes and an electrolyte. A fuel, such as hydrogen gas, for example, is introduced at a first electrode where it reacts electrochemically in the presence of the electrolyte and catalyst to produce electrons and cations in the first electrode. The electrons are circulated from the first electrode to a second electrode through an electrical circuit connected between the electrodes. Cations pass through the electrolyte to the second electrode. Simultaneously, an oxidant, typically air, oxygen enriched air or oxygen, is introduced to the second electrode where the oxidant reacts electrochemically in presence of the electrolyte and catalyst, producing anions and consuming the electrons circulated through the electrical circuit; the cations are consumed at the second electrode. The anions formed at the second electrode or cathode react with the cations to form a reaction product such as water. The first electrode or anode may alternatively be referred to as a fuel or oxidizing electrode, and the second electrode may alternatively be referred to as an oxidant or reducing electrode. The half-cell reactions at the two electrodes are, respectively, as follows:

First Electrode: 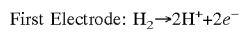

Second Electrode: 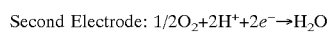

The external electrical circuit withdraws electrical current and thus receives electrical power from the cell. The overall fuel cell reaction produces electrical energy which is the sum of the separate half-cell reactions written above. Water and heat are typical by-products of the reaction.

In practice, fuel cells are not operated as single units. Rather, fuel cells are connected in series, stacked one on top of the other, or placed side by side. A series of fuel cells, referred to as fuel cell stack, is normally enclosed in a housing. The fuel and oxidant are directed through manifolds to the electrodes, while cooling is provided either by the reactants or by a cooling medium. Also within the stack are current collectors, cell-to-cell seals and insulation, with required piping and instrumentation provided externally of the fuel cell stack. The stack, housing, and associated hardware make up the fuel cell module.

Fuel cells may be classified by the type of electrolyte, which is either liquid or solid. The present invention is primarily concerned with fuel cells using a solid electrolyte, such as a proton exchange membrane (PEM). The PEM has to be kept moist with water because the membranes that are currently available will not operate efficiently when dry. Consequently, the membrane requires constant humidification during the operation of the fuel cell, normally by adding water to the reactant gases, usually hydrogen and air.

The proton exchange membrane used in a solid polymer fuel cell acts as the electrolyte as well as a barrier for preventing the mixing of the reactant gases. An example of a suitable membrane is a copolymeric perfluorocarbon material containing basic units of a fluorinated carbon chain and sulphonic acid groups. There may be variations in the molecular configurations of this membrane. Excellent performances are obtained using these membranes if the fuel cells are operated under fully hydrated, essentially water-saturated conditions. As such, the membrane must be continuously humidified, but at the same time the membrane must not be over humidified or flooded as this degrades performances. Furthermore, the temperature of the fuel cell stack must be kept above freezing in order to prevent freezing of the stack.

Cooling, humidification and pressurization requirements increase the cost and complexity of the fuel cell, reducing its commercial appeal as an alternative energy supply in many applications. Accordingly, advances in fuel cell research are enabling fuel cells to operate without reactant conditioning, and under air-breathing, atmospheric conditions while maintaining usable power output.

Where a solid polymer proton exchange membrane (PEM) is employed, this is generally disposed between two electrodes formed of porous, electrically conductive material. The electrodes are generally impregnated or coated with a hydrophobic polymer such as polytetrafluoroethylene. A catalyst is provided at each membrane/electrode interface, to catalyze the desired electrochemical reaction, with a finely divided catalyst typically being employed. The membrane/electrode assembly is mounted between two electrically conductive plates, each which has at least one (fluid) flow passage formed therein. The fluid flow conductive fuel plates are typically formed of graphite. The flow passages direct the fuel and oxidant to the respective electrodes, namely the anode on the fuel side and the cathode on the oxidant side. The electrodes are electrically connected in an electric circuit, to provide a path for conducting electrons between the electrodes. Electrical switching equipment and the like can be provided in the electric circuit as in any conventional electric circuit. The fuel commonly used for such fuel cells is hydrogen, or hydrogen rich reformate from other fuels ("reformate" refers to a fuel derived by reforming a hydrocarbon fuel into a gaseous fuel comprising hydrogen and other gases). The oxidant on the cathode side can be provided from a variety of sources. For some applications, it is desirable to provide pure oxygen, in order to make a more compact fuel cell, reduce the size of flow passages, etc. However, it is common to provide air as the oxidant, as this is readily available and does not require any separate or bottled gas supply. Moreover, where space limitations are not an issue, e.g. stationary applications and the like, it is convenient to provide air at atmospheric pressure. In such cases, it is common to simply provide channels through the stack of fuel cells to allow for flow of air as the oxidant, thereby greatly simplifying the overall structure of the fuel cell assembly. Rather than having to provide a separate circuit for oxidant, the fuel cell stack can be arranged simply to provide a vent, and possibly some fan or the like to enhance air flow.

SUMMARY OF THE INVENTION

The present invention relates to a self-contained, portable apparatus used to measure the real and imaginary components of the complex impedance of a fuel cell at discrete frequencies. The system comprises a CPU, frequency synthesizer, a fuel cell, a load bank and measurement and acquisition circuitry. The CPU receives input parameters from a software program and sends the parameters to a signal generation device which produces an AC waveform with a DC offset that is used to remotely program a load bank. The load bank draws current from the fuel cell. The voltage across the fuel cell and the current through the fuel cell are measured by voltage and current sensing circuitry, then digitized and averaged by an oscilloscope or A/D converter. This recorded data is sent to the CPU where the AC phase lead or lag is calculated. Numerous outputs can then be displayed by the invention, including real impedance, imaginary impedance, phase differential, leading component, lagging component, current magnitude, voltage magnitude and applied AC voltage.

Another aspect of the invention is that this apparatus allows for real-time measurements which can be continuously updated. These measurements can be automated to improve the measurement speed and simplicity which makes it very useful in assessing a large number of fuel cells. In addition, the effects of parameter changes such as flow rates, fuel cell temperature, and humidification levels on fuel cell impedance may be easily monitored when a fuel cell is interfaced with this measurement system. This can permit the modification of fuel cell operating parameters.

In accordance with a first aspect of the present invention, there is provided an apparatus for determining at least the real component of a fuel cell's complex impedance, the apparatus comprising, a load device, connectable to the fuel cell for drawing a current from the fuel cell; a voltage sensing circuit connectable across the fuel cell for in use sensing direct and alternating components of a voltage across the fuel cell; a current sensing circuit, for in use sensing direct and alternating components of a current drawn from the fuel cell by the load device; wherein the load device is configured to draw a direct current with a superimposed alternating current signal; and an analysis device, connected to the voltage sensing circuit and the current sensing circuit, for analyzing the detected direct and alternating components of the voltage and the detected direct and alternating components of the current to determine real and imaginary parts of the fuel cell impedance at different frequencies, whereby the real part of the fuel cell impedance can be determined.

In accordance with another aspect of the present invention, there is provided a method of determining at least a real component of a fuel cell's complex impedance, the method comprising:

(i) applying a load to the fuel cell so as to draw a current from the fuel cell, the current comprising a direct current component and an alternating current component;

(ii) varying the frequency of the alternating current component;

(iii) measuring the direct and alternating components of the voltage across the fuel cell and the direct and alternating components of the current drawn from the fuel cell;

(iv) from the measured current and the measured voltage determining the real impedance and imaginary impedance at different frequencies; and (v) from the real and imaginary impedances determined in the preceding step, determining the frequency at with the imaginary impedance is zero and determining the real impedance at said frequency, indicative of the total real impedance of the fuel cell.

DETAILED DESCRIPTION OF THE DRAWINGS

Figure 2:
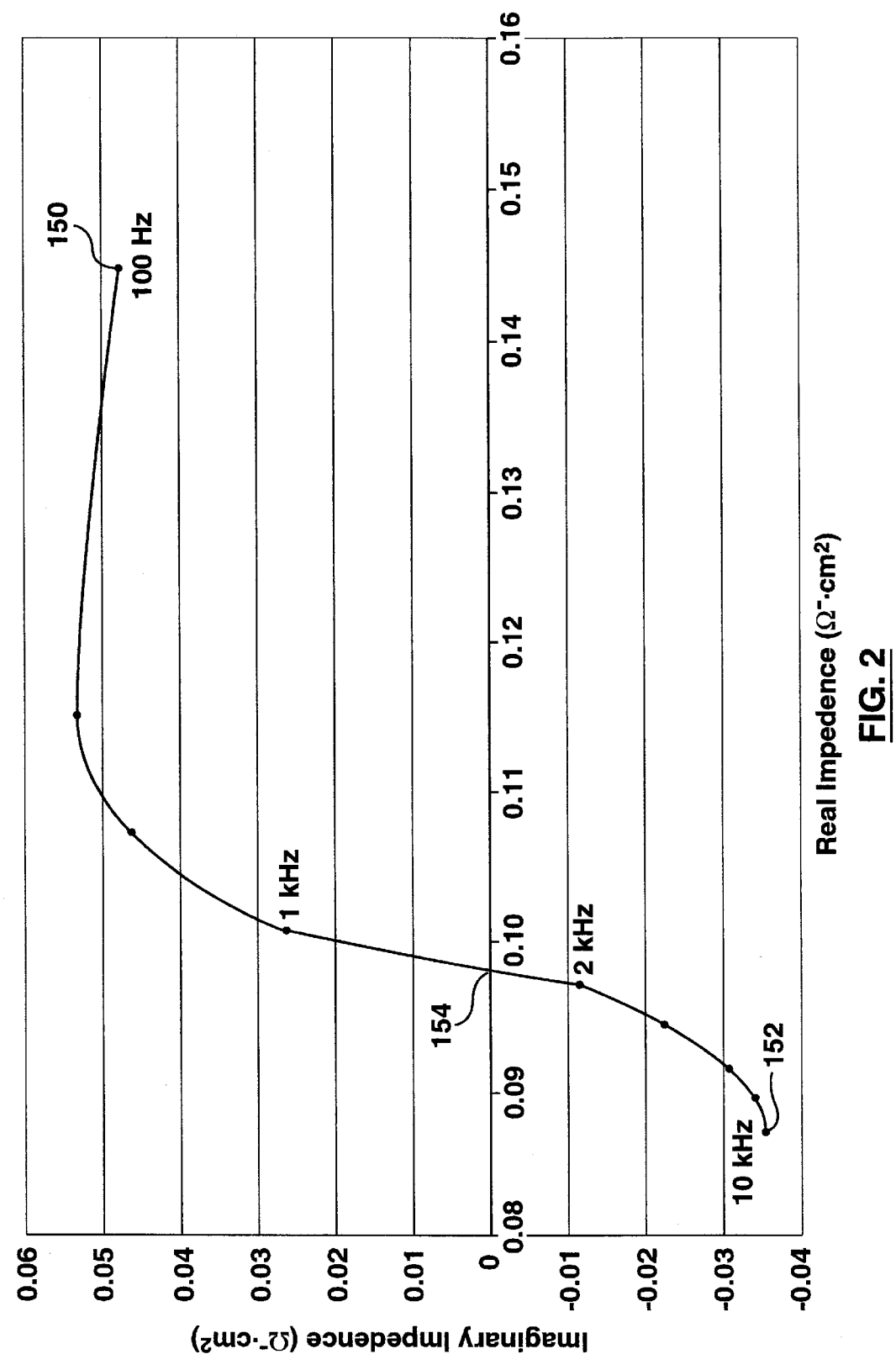

For a better understanding of the present invention and to show more clearly how it may be carried into effect, reference will now be made, by way of example, to the accompanying drawings in which:

FIG. 1 is a schematic view of an apparatus in accordance with a preferred embodiment of the present invention, incorporating a CPU, a frequency synthesizer, a test fuel cell, a load bank, and measurement and acquisition circuitry; and FIG. 2 is a Nyquist plot showing variation of Real and Imaginary impedance with frequency.

DETAILED DESCRIPTION OF THE PREFERRED EMBODIMENT

Reference is made to FIG. 1, which illustrates a preferred embodiment of a self-contained, portable apparatus 10 for impedance measurement of a fuel cell at discrete frequencies as described below. A CPU 20, accepts inputs from a software program 30 (in this case a custom in-house software program—FCATS, an acronym for Fuel Cell Automated Test Station) via an RS-232 serial link protocol 40. Some inputs include frequency, AC amplitude, DC offset current and fuel cell active area. The CPU 20 sends the input parameters to a frequency synthesizer 50 via a data bus 60. The CPU 20 also receives data comprising the measured voltage across the fuel cell and the measured current through the fuel cell from a waveform acquisition device 70 via an RS-232 serial link protocol 80. The CPU 20 then calculates various parameters of interest and outputs these parameters to the software program 30 via the RS-232 serial link protocol 40. The output parameters include real impedance, imaginary impedance, phase differential, leading component, lagging component, current magnitude, voltage magnitude and applied AC voltage.

A test fuel cell is indicated at 90 and is connected in series with a load bank 100. It will be understood that, in this context and in the claims, reference to a fuel cell means either a single fuel cell, a stack of fuel cells or one or more selected cells in a stack of cells. The load bank 100 is a standard load bank, which can be set to apply a desired voltage, or draw a desired current. As detailed below, for current measuring purposes, a shunt 110 is provided in the circuit including the fuel cell 90 and load bank 100.

The frequency synthesizer 50 is coupled to the load bank 100, for two purposes. Firstly, the frequency synthesizer 50 produces a periodic A.C. waveform at a desired frequency, and secondly the frequency synthesizer provides a DC offset which is used to remotely program the load bank 100. The DC offset or control signal programs the load bank 100 to draw a desired, large DC current. The A.C. waveform or signal is superimposed on the DC current and is generally smaller. The frequency synthesizer 50 is also coupled to the trigger input of the waveform acquisition device 70 via a decoupling capacitor/buffer combination 140.

The voltage drop across the fuel cell 90 is measured by a differential amplifier 120 in known manner. The current through the fuel cell 90 is measured indirectly, by measuring the voltage drop across the shunt resistor 110 using a differential amplifier 130.

The measured voltage drop across the fuel cell 90 and the current passing through the fuel cell 90 both of which voltage and current include direct and alternating components, are digitized and averaged using the waveform acquisition device 70, which can be an oscilloscope. Alternatively, an A/D converter may also be used for this purpose. The measured values are then sent to CPU 20 (where they are stored for processing) via the RS-232 serial link protocol 80. The CPU 20 uses this data to calculate the AC Phase lead or lag (in degrees) between the measured voltage drop across the fuel cell 90 and the measured current through the fuel cell 90. The CPU 20 then calculates the real and imaginary components of the impedance of fuel cell 90. These calculations are repeated at each desired frequency. A Nyquist plot is then generated by plotting the real impedance component versus the imaginary impedance component using one point per frequency. The frequency sweep allows one to determine at which frequency the imaginary component falls to zero. The real component at this frequency is a precise measure of the internal resistance of fuel cell 90. The inventors have noted error levels of less than 1% in magnitude and less than 1 degree in phase, when this invention was compared to much more costly bench-top, non-integrated systems.

Reference will now be made to FIG. 2, which shows an exemplary Nyquist plot obtained using the apparatus of the present invention. The horizontal axis shows real impedance in $\Omega cm^2$ and the vertical axis the imaginary impedance in $\Omega cm^2$. The values are determined by multiplying the actual impedance values by the surface areas of the cell, or of one cell in a stack of cells. This then gives an indication of the impedance values independent of the cell area, i.e. just determined by cell characteristics. As shown, the plot shows the variation resistance as frequency is varied from 100 kHz, as indicated at 150, through various points taken, including 1 kHz, 2 kHz, through to 10 kHz, indicated at 152. The first portion of the curve is above the horizontal axis, indicating a negative imaginary impedance, while the second portion is below the axis, indicative of a positive imaginary impedance. Where the curve crosses the axis, i.e. where there is 0 imaginary impedance, indicated at 154, the real impedance is approximately 0.098 $\Omega cm^2$. As the imaginary component is 0 at this point, this is the value of the real component of the resistance.

The fuel cell impedance measurement system 10 made in accordance with the current invention offers a number of benefits. Once a fuel cell's internal resistance is determined, fuel cells may be quickly and easily evaluated for their levels of electrical efficiency which will allow for easy comparison between different fuel cells. Limitations on older impedance measurement systems such as bulkiness and excessive cost have been eliminated. The apparatus can be portable, weighing under 30 pounds, and is compatible with PC applications using the RS-232 communication protocol, and it will be understood that it can be readily adopted for any other standard communication protocols.

The fuel cell impedance measurement system 10 also allows for real-time measurements which can be continuously updated. These measurements can be automated to improve measurement speed and simplicity. Thus the effects of parameter changes such as flow rates, fuel cell temperature, and humidification levels on fuel cell impedance may be easily monitored when the fuel cell is interfaced both with the fuel cell impedance measurement system 10 and the FCATS software 30. This software 30 permits modification of fuel cell operating parameters.

The invention is particularly useful (but not limited to) fuel cell membrane evaluation, optimal conditioning assessments, and as a feedback mechanism (directing the balance of plant, or fuel cell conditioning during times of high impedance). Ultimately, it is anticipated that this invention could be used in automotive or vehicle applications as well as stationary applications, as a controller of fuel cell parameters such as gaseous flows, humidification and temperature.

It should be understood that various modifications can be made to the preferred embodiment described and illustrated herein, without departing from the present invention, the scope of which is defined in the appended claims.

What is claimed is:

1. An apparatus for determining at least the real component of a fuel cell's complex impedance, the apparatus comprising, a load device, connectable to the fuel cell for drawing a current from the fuel cell; a voltage sensing circuit connectable across the fuel cell for in use sensing direct and alternating components of a voltage across the fuel cell; a current sensing circuit, for in use sensing direct and alternating components of a current drawn from the fuel cell by the load device, wherein the load device is configured to draw a direct current with a superimposed alternating current signal; and an analysis device, connected to the voltage sensing circuit and the current sensing circuit for analyzing the detected direct and alternating components of the voltage and the detected direct and alternating components of the current to determine real and imaginary parts of the fuel cell impedance at different frequencies, whereby the real part of the fuel cell impedance can be determined.

2. An apparatus as claimed in claim 1, wherein the analysis device comprises a waveform acquisition device, receiving measurement data of voltage across the fuel cell and current through the fuel cell, as measured by the voltage measuring circuit and the current measuring circuits; and a separate data processing device connected thereto.

3. An apparatus as claimed in claim 2, wherein the load device comprises a load bank, programmable to provide one of a desired direct current load and a desired voltage, and means for superimposing an alternating current signal on a DC current flowing through the fuel cell and the load bank.

4. An apparatus as claimed in claim 3, wherein the means for imposing the alternating current signal comprises a frequency synthesizer.

5. An apparatus as claimed in claim 4, wherein the frequency synthesizer is connected to the load bank, for applying the alternating current signal to the load bank and for supplying a program signal to the load bank, to program the load bank to a desired level.

6. An apparatus as claimed in claim 5, wherein the frequency synthesizer is connected to the waveform acquisition device through one of a capacitor and a buffer.

7. An apparatus as claimed in claim 6, wherein the data processing device is connected to the frequency synthesizer, for supplying signal parameters to the frequency synthesizer.

8. An apparatus as claimed in claim 7, wherein the data processing device is connected to a software program for supplying data on a fuel cell's characteristics.

9. An apparatus as claimed in claim 8, wherein the data processing device comprises one of an embedded CPU or microprocessor.

10. An apparatus as claimed in claim 9, wherein the frequency synthesizer includes an accompanying digital to analog converter which produces a desired waveform.

11. An apparatus as claimed in claim 1, 2 or 10 wherein the voltage sensing circuitry comprises a differential amplifier.

12. An apparatus as claimed in claim 11 wherein the current sensing circuitry comprises a shunt resistor, for series connection with the fuel cell and the load device, and a second differential amplifier connected across the shunt resistor.

13. An apparatus as claimed in claim 12, wherein the waveform acquisition device comprises an oscilloscope.

14. An apparatus as claimed in claim 12, wherein the waveform acquisition device comprises an A/D converter.

15. A method of determining at least a real component of a fuel cell's complex impedance, the method comprising:
  (i) applying a load to the fuel cell so as to draw a current from the fuel cell, the current comprising a direct current component and an alternating current component;
  (ii) varying the frequency of the alternating current component;
  (iii) measuring the direct and alternating components of voltage across the fuel cell and direct and alternating components of the current drawn from the fuel cell;
  (iv) from the measured current and the measured voltage determining the real impedance and the imaginary impedance at different frequencies; and
  (v) from the real and imaginary impedances determined in the preceding step, determining the frequency at which the imaginary impedance is zero and determining the real impedance at said frequency, indicative of the total real impedance of the fuel cell.

16. A method as claimed in claim 15, which includes providing a load bank, connecting the load bank in series with the fuel cell and setting the load bank to a desired value to determine the DC current drawn from the fuel cell.

17. A method as claimed in claim 16, which includes providing the AC current from a frequency synthesizer and superimposing the AC current on the direct current flowing through the load bank.

18. A method as claimed in claim 17, which includes providing a first differential amplifier connected across the fuel cell for determining the voltage across the fuel cell, providing a shunt connected in series with the fuel cell and the load bank, and providing a second differential amplifier connected across the shunt and determining the current flowing through the fuel cell from the voltage across the shunt.

19. A method a claimed in claim 18, which includes processing waveforms from the first and second differential amplifiers in the waveform acquisition device, and passing measurement data from the waveform acquisition device to a data processing device.

20. A method as claimed in claim 19, which includes providing connections between the frequency synthesizer and the waveform acquisition device and between the data processing device and the frequency synthesizer for transfer of data, and supplying signal parameters to the frequency synthesizer from the data processing device.

* * * * *